United States Patent [19]

Yanagisawa et al.

[11] Patent Number: 5,571,321
[45] Date of Patent: Nov. 5, 1996

[54] METHOD FOR PRODUCING A GALLIUM PHOSPHIDE EPITAXIAL WAFER

[75] Inventors: Munehisa Yanagisawa, Takasaki; Yuuki Tamura; Susumu Arisaka, both of Annaka; Hidetoshi Matsumoto, Matsuida-machi, all of Japan

[73] Assignee: Shin-Etsu Handotai Co., Ltd., Japan

[21] Appl. No.: 327,783

[22] Filed: Oct. 20, 1994

[30] Foreign Application Priority Data

Nov. 22, 1993 [JP] Japan .................................. 5-291656

[51] Int. Cl.$^6$ ................................................ H01L 21/20
[52] U.S. Cl. .............................. 117/56; 117/58; 117/955; 437/127
[58] Field of Search ........................... 117/56, 58, 955; 437/127, 130

[56] References Cited

U.S. PATENT DOCUMENTS

| | | |
|---|---|---|
| 3,619,304 | 11/1971 | Naito et al. ............................ 117/955 |
| 3,972,750 | 8/1976 | Gutierrez et al. . |
| 4,008,106 | 2/1977 | Gutierrez et al. . |
| 4,477,294 | 10/1984 | Gutierrez et al. . |

FOREIGN PATENT DOCUMENTS

| | | |
|---|---|---|
| 146669 | 2/1981 | Germany . |
| 01245569 | 12/1989 | Japan . |
| 1320043 | 8/1970 | United Kingdom . |

OTHER PUBLICATIONS

"GaP Liquid Phase Epitaxial Growth and Light Emitting Diodes I"; Tsuyoshi Kotani et al.; Fujitsu–Scientific and Technical Journal, vol. 9, No. 3, Sep. 1973, pp. 133–148.

"Evaluation of a Liquid phase Epitaxy System for Production of GaP P-N Junction Material"; Electrochemical Society, vol. 72–2, No. 230, Oct. 1974, Florida; pp. 572–574; R. C. Vehse et al.

*Primary Examiner*—Nam Nguyen
*Assistant Examiner*—Linda J. Fleck
*Attorney, Agent, or Firm*—Whitham, Curtis, Whitham & McGinn

[57] ABSTRACT

This disclosure herein pertains to a method for producing a GaP epitaxial wafer used for fabrication of light emitting diodes having higher brightness than light emitting diodes fabricated from a GaP epitaxial wafer produced by a conventional method have. The method comprises the steps of: preparing a GaP layered substrate 15 with one or more GaP layers on a GaP single crystal substrate 10 in the first series of liquid phase epitaxial growth; obtaining a layered GaP substrate 15a by eliminating surface irregularities of said GaP layered substrate 15 by mechano-chemical polishing to make the surface to be planar; and then forming a GaP light emitting layer composite 19 on said layered GaP substrate 15a in the second series of liquid phase epitaxial growth.

1 Claim, 3 Drawing Sheets

FIG. 1(A)
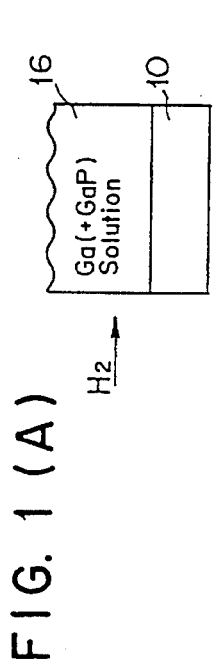
FIG. 1(B)
FIG. 1(C)
FIG. 1(D)
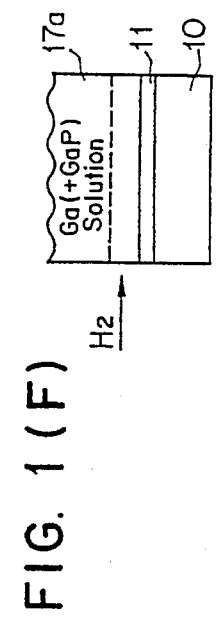
FIG. 1(E)
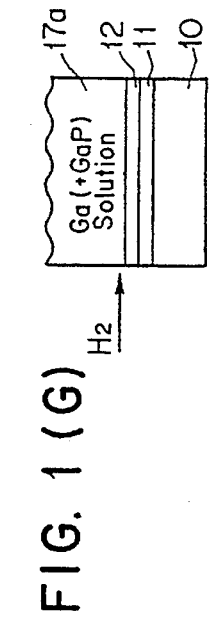
FIG. 1(F)
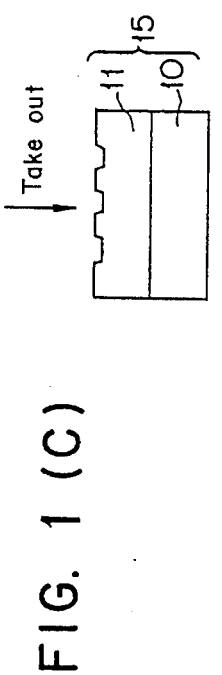
FIG. 1(G)
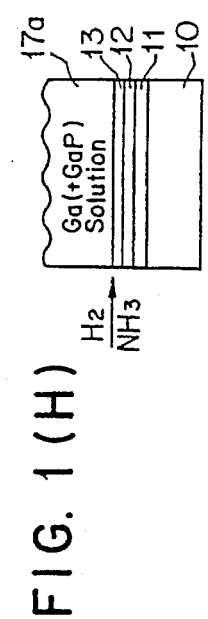
FIG. 1(H)
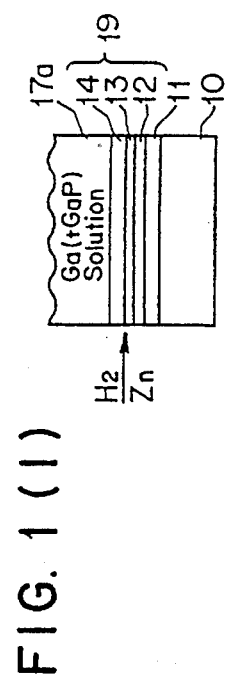
FIG. 1(I)

METHOD FOR PRODUCING A GALLIUM PHOSPHIDE EPITAXIAL WAFER

BACKGROUND OF THE INVENTION

1. Field of the Invention

The present invention relates to a method for producing electroluminescent materials used for fabricating GaP light emitting devices, which materials have a structure of a plurality of GaP layers epitaxially grown on a GaP single crystal substrate (hereafter referred to as GaP epitaxial wafer).

2. Description of the Prior Art

In general, GaP light emitting diodes are fabricated in such a manner that first one or more GaP crystal layers of both n-type and p-type are consecutively one by one laminated on an n-type GaP single crystal substrate to produce a GaP epitaxial wafer including a pn junction and then said GaP epitaxial wafer is processed into the devices. In the mean time, GaP light emitting diodes are largely divided into three kinds in regard to the colors of emitted light, such as a green GaP light emitting diode (or yellowish green GaP light emitting diode), a red GaP light emitting diode and a pure green GaP light emitting diode.

A green GaP light emitting diode 2 is fabricated from a GaP epitaxial wafer as shown in FIG. 2, in which Nitrogen atoms (N) serving as luminescence centers are doped in the portion of the n-type GaP layer in the vicinity of the pn junction and emits yellowish green light with the peak wavelength of about 567 nm.

A red GaP light emitting diode 4 is fabricated from a GaP epitaxial wafer as shown in FIG. 3, in which Zinc (Zn) and Oxygen (O) are both doped in the p type layer to form Zn-O pairs serving as luminescence centers and emits red light with the peak wavelength of about 700 nm.

A pure green GaP light emitting diode 6 is fabricated from a GaP epitaxial wafer as shown in FIG. 4, which has no dopant as luminescence centers therein and emits pure green light with the peak wavelength of about 555 nm.

The GaP epitaxial wafer 2 used for fabricating green light emitting diodes, the GaP epitaxial wafer 4 used for fabricating red light emitting diodes and the GaP epitaxial wafer 6 used for fabricating pure green light emitting diodes are illustrated in sectional structure respectively in FIGS. 2, 3 and 4, as an example for each. The GaP epitaxial wafer 2 for green light diodes has a structure in which an n-type GaP buffer layer 11a, an n-type GaP layer 12a, a Nitrogen doped n-type GaP layer 13a and a p-type GaP layer 14a are consecutively in that order formed on an n-type GaP single crystal substrate 10a; the GaP epitaxial wafer 4 for red light emitting diodes has a structure in which an n-type GaP layer 11b and a p-type GaP layer 14b including Zn-O pairs therein are consecutively formed on an n-type GaP single crystal substrate 10b; and the GaP epitaxial wafer 6 for pure green light emitting diodes has a structure in which an n-type GaP buffer layer 11c, an n-type GaP layer 12c, an n-type GaP layer or a p-type GaP layer with a lower carrier density and a p-type GaP layer 14c are consecutively in that order formed on an n-type GaP single crystal substrate 10c.

Among methods by which GaP layers are consecutively formed on a GaP single crystal substrate or a GaP layer(s) which has been formed on the GaP single crystal substrate in the preceding step(s) as mentioned above, an established method is a liquid phase epitaxial method by cooling a saturated Ga solution of GaP (hereinafter referred to as liquid phase epitaxial method or liquid phase epitaxial growth). The liquid phase epitaxial method is further divided into two methods, which consist of a melt-back method and a non-melt-back method. The non-melt-back method is performed in the following way: GaP polycrystal is dissolved into Ga melt at, for example, 1060° C. to prepare Ga solution saturated with GaP as solute at 1060° C. Then a GaP substrate is contacted with the Ga solution and both of them are gradually cooled so that the GaP solute in the Ga solution is deposited on the GaP substrate as a grown GaP layer. On the other hand the melt-back method is performed in the following way: a GaP substrate is contacted with Ga melt. Then both of them are together heated up to, for instance, 1060° C. so that the upper portion of the GaP substrate is dissolved into the Ga melt to form Ga solution saturated with GaP as solute at 1060° C., and thereafter the substrate and the Ga solution are both gradually cooled to have a GaP layer grown on the GaP substrate in the same manner as in the non-melt-back method.

A GaP epitaxial wafer for light emitting diodes is usually produced by way of a liquid phase epitaxial method consisting of two steps (hereinafter specially referred to as two step method).

Referring to FIG. 2, the two step method will be described first taking as an example a GaP epitaxial wafer 2 used for fabricating green light emitting diodes. In the first step, an n-type GaP buffer layer 11a is formed on an n-type GaP single crystal substrate 10a by a non-melt-back method or a melt-back method (hereinafter the thus processed substrate is referred to as a layered substrate). In the second step, the melt-back method is applied to the layered GaP substrate. That is, an n-type GaP layer 12a, a Nitrogen doped n-type GaP layer 13a and a p-type GaP layer 14a are further consecutively in that order formed on the n-type GaP buffer layer 11a of the layered GaP substrate the melt-back method.

In the cases of a two step method GaP epitaxial wafer for red light emitting diodes and a two step method GaP epitaxial wafer for pure green light emitting diodes, layered GaP substrates are an n-type GaP layer 11b on an n-type GaP single crystal substrate 10b and an n-type GaP buffer layer 11c on an n-type GaP single crystal substrate 10c respectively.

Hereinafter a plurality of GaP layers formed by a liquid phase epitaxial growth on a layered GaP substrate is generically named a GaP light emitting layer composite. For example, in case of a GaP epitaxial wafer 2 for green light emitting diodes as shown in FIG. 2, three layers of an n-type GaP layer 12a, a Nitrogen doped n-type GaP layer 13a and a p-type GaP layer 14a are called a GaP light emitting layer composite 19a of the GaP epitaxial wafer 2 for green light emitting diodes, while in case of a GaP epitaxial wafer 6 for the pure green light emitting diodes as shown in FIG. 4, three layers of an n-type GaP layer 12c, an n-type GaP layer or a p-type GaP layer 13c with a lower carrier concentration and a p-type GaP layer 14c are called a GaP light emitting layer composite 19c of the GaP epitaxial wafer 6 for pure green light emitting diodes. A p-type GaP layer 14b, which is of a single layer, of a GaP epitaxial wafer 4 for red light emitting diodes as shown in FIG. 3 is also called a GaP light emitting layer composite 14b of the GaP epitaxial wafer 4 for red light emitting diodes.

In the first step of the two step method, more than one GaP layers may be formed on a GaP single crystal substrate in order to further improve a characteristic(s) of a light emitting diode, though a monolayered GaP substrate is taken up as an example for the purpose of illustration only in the description above.

A two step method with a layered GaP substrate having more than one layers therein is conventionally considered useful for achieving higher brightness. However, even a thus produced GaP epitaxial wafer for light emitting diodes has still a problem by which said GaP epitaxial wafer can not achieve desired brightness of the light emitting diodes therefrom under the present requirement for increasingly higher brightness.

As the results of the research conducted by the inventors in regard to the factors lowering brightness of a light emitting diode, the following discoveries have been obtained that surface irregularities accompanying crystallographic defects are generated on the surface of a GaP layer formed on a GaP single crystal substrate and the surface irregularities give an ill influence to deteriorate the crystallinity of a following light emitting layer composite, which is formed on said layered GaP substrate in the following step of liquid phase epitaxial growth. Deterioration of said composite necessarily results in lowering the brightness of light emitting diodes.

SUMMARY OF THE INVENTION

The present invention was made based on the above discoveries and knowledge to solve the problem and therefore it is an object of the present invention to provide a method for producing a GaP epitaxial wafer used for fabricating light emitting diodes with higher brightness than conventional light emitting diodes.

The method according to the present invention comprises the following steps of: a layered GaP substrate being prepared by forming one or more GaP layers on a GaP single crystal substrate in the first liquid phase epitaxial growth and a GaP light emitting layer composite being formed on said layered GaP substrate in the second liquid phase epitaxial growth, where surface irregularities of said layered GaP substrate, which are generated on the surface during the first liquid phase epitaxial growth, are eliminated to make the surface to be planar before the second liquid phase epitaxial growth gets started.

As for making the surface to be planar, a mirror polishing means may be applied to the surface of a layered GaP substrate to eliminate the surface irregularities from the surface and thereby obtain the planar surface.

BRIEF DESCRIPTION OF THE DRAWINGS

The above and other objects, and features of the present invention will appear more fully hereinafter from a consideration of the following description taken in connection with the accompanying drawings, in which:

FIG. 1(A), FIG. 1(B), FIG. 1(C), FIG. 1(D), FIG. 1(E), FIG. 1(F), FIG. 1(G), FIG. 1(H) and FIG. 1(I) are a process diagram illustrating an embodiment of the method according to the present invention;

DETAILED DESCRIPTION OF THE PREFERRED EMBODIMENT

Figure 2:
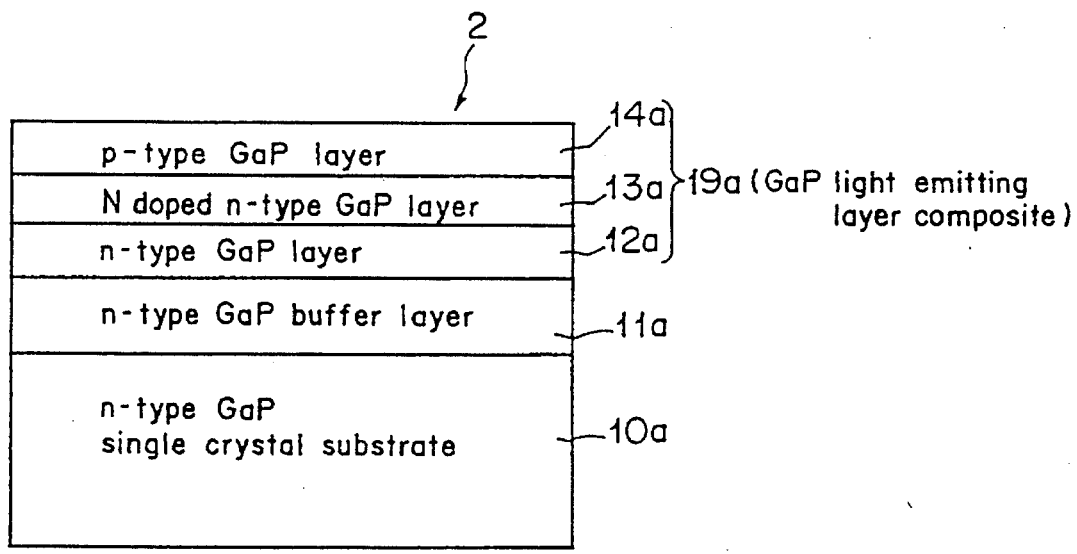
FIG. 2 is a sectional view of a GaP epitaxial wafer used for fabricating green light emitting diodes.
Figure 3:
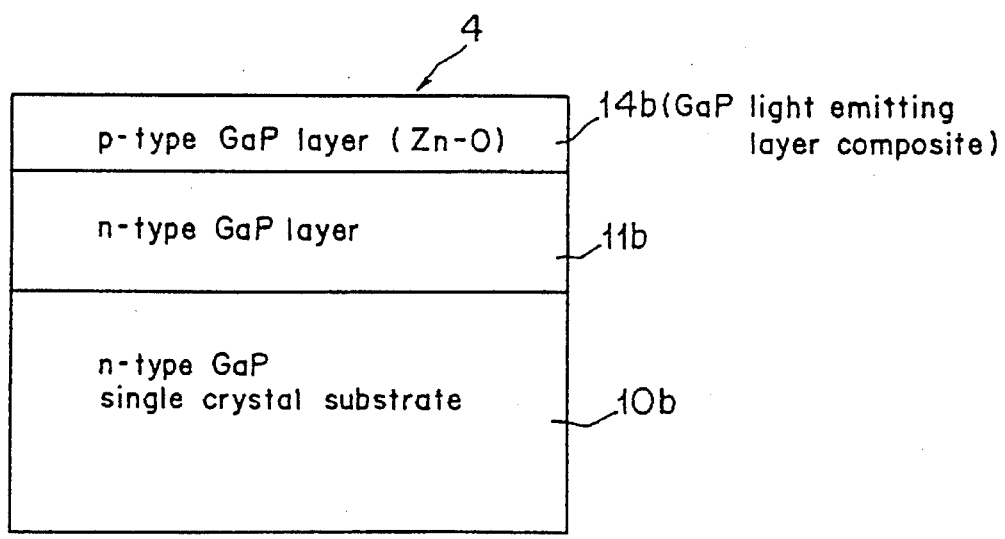
FIG. 3 is a sectional view of a GaP epitaxial wafer used for fabricating red light emitting diodes.
Figure 4:
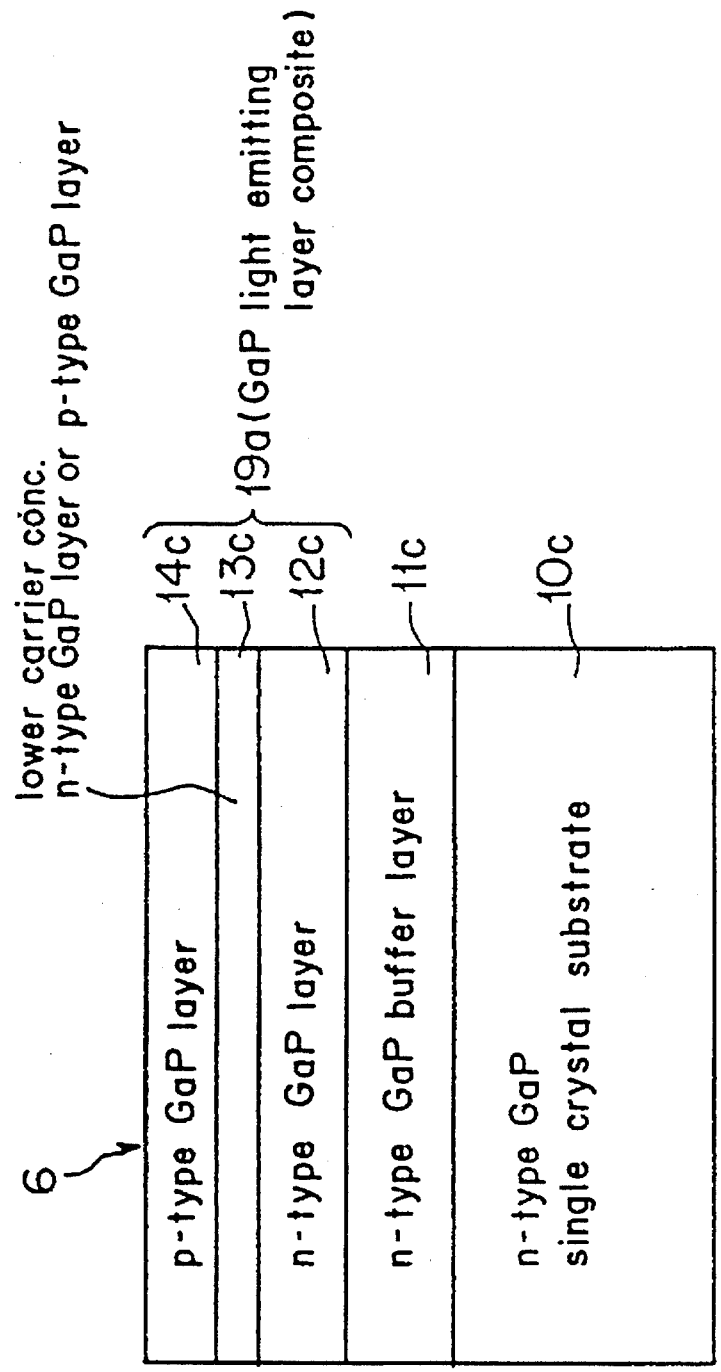
FIG. 4 is a sectional view of a GaP epitaxial wafer used for fabricating pure green light emitting diodes.

Below will an embodiment of the method according to the present invention be described in the case of production of a GaP epitaxial wafer used for fabricating green light emitting diodes, as an example, in reference to the accompanying drawings.

FIGS. 1(A) to 1(I) show a process diagram in a producing method of a GaP epitaxial wafer used for green light emitting diodes.

As shown in FIG. 1(A), a Ga solution 16, which is prepared by dissolving GaP polycrystal and Te as n-type dopant into Ga melt at 1060° C., is brought into contact with an n-type GaP single crystal substrate 10, where the Ga solution 16 is saturated with GaP at 1060° C. Then, the Ga solution 16 and the GaP substrate 10 are both gradually cooled in a stream of Hydrogen as carrier gas so that the GaP solute deposits partly on the n-type GaP single crystal substrate 10. In such a manner, an n-type GaP buffer layer 11 of about 150 μm thickness is formed on the n-type GaP single crystal substrate 10 to make a GaP layered substrate 15 (FIG. 1(B)).

The layered GaP substrate 15 is taken out of a growth furnace (FIG. 1(c)), and the surface portion of the n-type GaP buffer layer 11 is mechano-chemically polished off by about 20 μm in depth with GaP polishing slurry (Fujimi Incorp. made, Trade Mark: INSEC P) and thereby a mirror-polished and planar surface is achieved on the surface of the layered GaP substrate 15a (FIG. 1(D)).

As shown in FIG. 1(E), the layered GaP substrate 15a, which as mentioned above is obtained by polishing off in part the surface portion of the n-type GaP buffer layer 11, is arranged to be contacted with Ga melt 17 free of both n-type dopant and GaP polycrystal, when the temperature of the Ga melt 17 and the substrate 15a are both set to 600° C.

In the following stage, the Ga melt 17 and the substrate 15a are both heated up to 1000° C. to dissolve the upper portion of the n-type GaP buffer layer 11 (doped with Te) into the Ga melt 17, which becomes a Ga solution 17a saturated with GaP at 1000° C. (FIG. 1(F)).

After an n-type GaP layer 12 doped with Te as n-type dopant is grown as the temperature is adjusted downward (FIG. 1(G)), the temperature is adjusted further downward in a stream of $NH_3$ and Hydrogen as carrier gas to form a Nitrogen doped n-type GaP layer 13, which is doped with Nitrogen (N) as luminescence centers and Te as n-type dopant (FIG. 1(H)).

Then the $NH_3$ flow is stopped and the temperature of Zn source is raised to about 700° C. to evaporate Zn. And after that the temperature of the Ga solution 17a and the substrate 10 with the layer(s) formed thereon are still further adjusted downward. In this condition, vapor Zn is carried on the Hydrogen stream to form a p-type GaP layer 14 doped with Zn on the Nitrogen doped n-type GaP layer 13 (FIG. 1(I)). As shown in FIG. 1(I), the GaP light emitting layer composite 19 of the GaP epitaxial wafer for green light emitting diodes consists of the three layers of the n-type layer 12, the Nitrogen doped n-type GaP layer 13 and the p-type GaP layer 14.

In such a manner, the n-type GaP buffer layer 11, the n-type GaP layer 12, the Nitrogen doped n-type GaP layer 13 and the p-type GaP layer 14 are consecutively in that order formed on the n-type GaP single crystal substrate 10 and thereby the GaP epitaxial wafer for green light emitting diodes is produced. The thus produced GaP epitaxial wafer is further processed into green light emitting diodes in a device fabrication process.

GaP epitaxial wafers for green light emitting diodes produced by the method according to the present invention and those produced by a conventional method, where the same steps of processing are adopted except for the elimination of surface irregularities of a layered GaP substrate prior to the following growth of a GaP light emitting layer composite, were both evaluated to compare the respective characteristics, as shown in Table 1, which is described below,

TABLE 1

|  | Mechano-chemical Polishing Step | Relative Brightness | Defect Density in Light Emitting layer Composite Defects/cm$^2$ |
|---|---|---|---|
| Embodiment of Invention | yes | 93.0 | $1 \sim 3 \times 10^4$ |
| Comparison | no | 73.8 | $1 \sim 5 \times 10^6$ | where each pair of the brightness and defect density shown in the table 1 is the respective averages computed from the data of 100 wafers produced in five batches at 20 wafers a batch according to the method of the present invention or the conventional method.

As clearly understood from the values of the brightness and defect density in the table 1, the brightness achieved by the method according to the present invention is improved by about 26% over that by the conventional method. This improvement is inferred to be realized due to betterment in the crystallinity of a light emitting layer composite or in other words preventing it from being deteriorated.

Further the method according to the present invention was applied for production of a GaP epitaxial wafer for red emitting diodes and a GaP epitaxial wafer for pure green light emitting diodes and as a result about 25% respective improvements on the average in brightness were achieved in both groups of the light emitting diodes over the brightness on the average from the comparative samples thereof.

What is claimed is:

1. A method for producing a GaP epitaxial wafer having a structure for emitting green light comprising the steps of growing an n-type GaP buffer layer on an n-type GaP single crystal substrate by liquid phase epitaxy using a gallium solution containing n-type solutes and GaP while gradually lowering a temperature of said gallium solution;

planarizing a surface of said n-type GaP buffer layer;

dissolving a surface portion of said n-type GaP buffer layer in a heated gallium melt, subsequent to said planarization step, to form a saturated gallium solution;

lowering a temperature of said gallium solution to grow a second n-type GaP layer on said n-type GaP buffer layer by liquid phase epitaxy;

growing, by liquid phase epitaxy, a third GaP layer on said second n-type GaP layer, said third GaP layer being a nitrogen doped n-type GaP layer, by further lowering said temperature of said gallium solution while supplying nitrogen as a further dopant subsequent to said step of lowering said temperature of said gallium solution to grow said second n-type GaP layer; and growing, by liquid phase epitaxy, a fourth GaP layer on said third GaP layer, said fourth GaP layer being a p-type GaP layer, by still further lowering said temperature of said gallium solution while supplying a p-type dopant as a further dopant subsequent to said step of lowering said temperature of said gallium solution to grow said third GaP layer.

* * * * *